(12) United States Patent
Waite et al.

(10) Patent No.: US 6,972,478 B1
(45) Date of Patent: Dec. 6, 2005

(54) INTEGRATED CIRCUIT AND METHOD FOR ITS MANUFACTURE

(75) Inventors: Andrew M. Waite, Hopewell Junction, NY (US); Scott Luning, Poughkeepsie, NY (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 11/075,774

(22) Filed: Mar. 7, 2005

(51) Int. Cl.$^7$ .............................................. H01L 29/04
(52) U.S. Cl. ...................................... 257/627; 257/347
(58) Field of Search .................. 257/347, 348, 257/349, 350, 351, 352, 353, 354, 627, 628, 257/618, 521, 527; 438/149, 478, 479, 480, 438/481, 150, 151, 152, 153, 154, 155, 156, 438/157, 158, 159, 160, 161, 162, 163, 164, 438/165, 166, 222, 226, 341

(56) References Cited

U.S. PATENT DOCUMENTS 5,384,473 A * 1/1995 Yoshikawa et al.
2004/0256700 A1 * 12/2004 Doris et al.

* cited by examiner

*Primary Examiner*—Nathan J. Flynn
*Assistant Examiner*—Kevin Quinto
(74) *Attorney, Agent, or Firm*—Ingrassia Fisher & Lorenz, P.C.

(57) ABSTRACT

An integrated circuit and methods for its manufacture are provided. The integrated circuit comprises a bulk silicon substrate having a first region of <100> crystalline orientation and a second region of <110> crystalline orientation. A layer of silicon on insulator overlies a portion of the bulk silicon substrate. At least one field effect transistor is formed in the layer of silicon on insulator, at least one P-channel field effect transistor is formed in the second region of <110> crystalline orientation, and at least one N-channel field effect transistor is formed in the first region of <100> crystalline orientation.

21 Claims, 8 Drawing Sheets

INTEGRATED CIRCUIT AND METHOD FOR ITS MANUFACTURE

TECHNICAL FIELD

The present invention generally relates to a FET IC and to a method for its manufacture, and more particularly relates to a FET IC having SOI devices as well as PFET and NFET Hybrid Orientation (HOT) devices and to a method for its manufacture.

BACKGROUND

The majority of present day integrated circuits (ICs) are implemented by using a plurality of interconnected field effect transistors (FETs), also called metal oxide semiconductor field effect transistors (MOSFETs or MOS transistors). The ICs are usually formed using both P-channel and N-channel FETs and the IC is then referred to as a complementary MOS or CMOS circuit. Certain improvements in performance of FET ICs can be realized by forming the FETs in a thin layer of silicon overlying an insulator layer. Such silicon on insulator (SOI) FETs, for example, exhibit lower junction capacitance and hence can operate at higher speeds. The silicon substrate in which the FETs are fabricated, whether a bulk silicon substrate or SOI, is usually of <100> crystalline orientation. This crystalline orientation is selected because the <100> crystalline orientation results in the highest electron mobility and thus the highest speed N-channel FETs. Additional performance enhancements can be realized in a CMOS circuit by enhancing the mobility of holes in the P-channel FETs. The mobility of holes can be enhanced by fabricating the P-channel FETs on silicon having a <110> crystalline orientation. Hybrid orientation techniques (HOT) use <100> crystalline orientation for N-channel FETs and <110> crystalline orientation for P-channel FETs.

Accordingly, it is desirable to combine in a single integrated circuit the favorable characteristics of silicon on insulator FETs with the favorable characteristics that can be realized with hybrid orientation techniques. In addition, it is desirable to provide a method for manufacturing CMOS integrated circuits that combine SOI FETs on the same substrate with bulk HOT N-channel and P-channel FETs. Furthermore, other desirable features and characteristics of the present invention will become apparent from the subsequent detailed description and the appended claims, taken in conjunction with the accompanying drawings and the foregoing technical field and background.

BRIEF SUMMARY

A CMOS integrated circuit is provided that takes advantage of the characteristics of bulk hybrid oriented (HOT) transistors in combination with silicon on insulator transistors. The integrated circuit takes advantage of the increased mobility of holes in bulk silicon of <110> crystalline orientation and electrons in bulk silicon of <100> orientation. The integrated circuit comprises a bulk silicon substrate having a first region of <100> crystalline orientation and a second region of <110> crystalline orientation. A layer of silicon on insulator overlies a portion of the bulk silicon substrate. At least one field effect transistor is formed in the layer of silicon on insulator, at least one P-channel field effect transistor is formed in the second region of <110> crystalline orientation, and at least one N-channel field effect transistor is formed in the first region of <100> crystalline orientation.

A method is provided for manufacturing such a CMOS integrated circuit. The method comprises the steps of providing a silicon substrate having a first crystalline orientation with an overlying silicon layer of second crystalline orientation. A silicon on insulator layer is formed overlying a portion of the silicon layer. A first epitaxial layer having the first crystalline orientation is grown on a portion of the silicon substrate and a second epitaxial layer having the second crystalline orientation is grown on a portion of the silicon layer. A first HOT field effect transistor is formed in the first epitaxial layer, a second HOT field effect transistor is formed in the second epitaxial layer, and a third field effect transistor is formed in the silicon on insulator layer.

BRIEF DESCRIPTION OF THE DRAWINGS

The present invention will hereinafter be described in conjunction with the following drawing figures, wherein like numerals denote like elements, and wherein.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

FIGS. 1–13 schematically illustrate a CMOS integrated circuit 20 and method steps for the manufacture of such a CMOS integrated circuit in accordance with various embodiments of the invention. In these illustrative embodiments only a small portion of CMOS integrated circuit 20 is illustrated. Various steps in the manufacture of CMOS devices are well known and so, in the interest of brevity, many conventional steps will only be mentioned briefly herein or will be omitted entirely without providing the well known process details.

Figure 1:
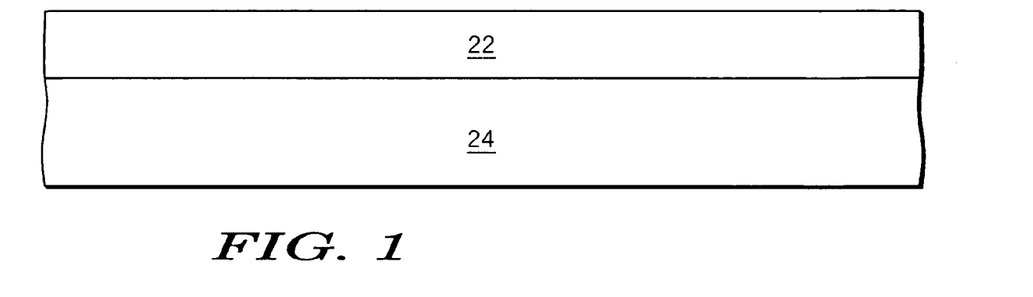
FIGS. 1–13 illustrate schematically, in cross section, one embodiment of an integrated circuit and method steps for its manufacture.

As illustrated in FIG. 1, the method in accordance with one embodiment of the invention begins with a silicon layer 22 bonded to a silicon carrier substrate 24. As used herein, the terms "silicon layer" and "silicon substrate" will be used to encompass the relatively pure silicon materials typically used in the semiconductor industry as well as silicon admixed with other elements such as germanium, carbon, and the like to form crystalline semiconductor material. Silicon layer 22 and silicon carrier substrate 24 will be used in the formation of bulk hybrid orientation (HOT) transistors. Silicon layer 22 is bonded to silicon carrier substrate 24 by well known wafer bonding techniques, and the silicon layer is thinned, for example, by chemical mechanical planarization (CMP) techniques to a thickness of about 300 nanometers (nm). The silicon layer and the silicon carrier substrate have different crystalline orientations. One of the silicon layer or the silicon carrier substrate is selected to have a <100> crystalline orientation and the other is selected to have a <110> crystalline orientation. In a preferred embodiment, but without limitation, the silicon layer will have a <100> crystalline orientation and the silicon carrier substrate will have a <110> crystalline orientation. In an alternate embodiment of the invention the silicon layer will have a <110> crystalline orientation and silicon carrier substrate will have a <100> crystalline orientation. By <100> crystalline orientation or <110> crystalline orientation is meant a crystalline orientation that is within about ±2° of the true crystalline orientation. Both the silicon layer and the silicon carrier substrate preferably have a resistivity of at least about 18–33 Ohms per square. The silicon can be impurity doped either N-type or P-type, but is preferably doped P-type.

Figure 2:
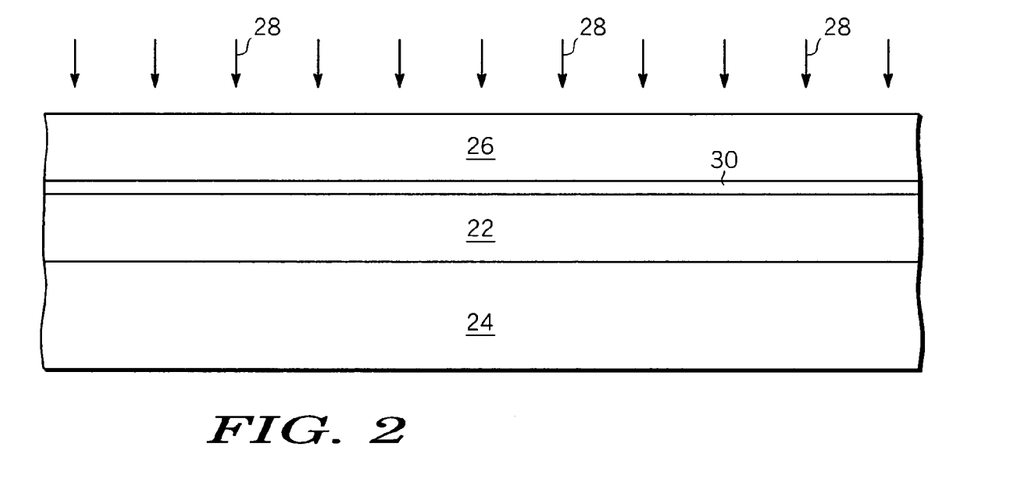
Figure 3:
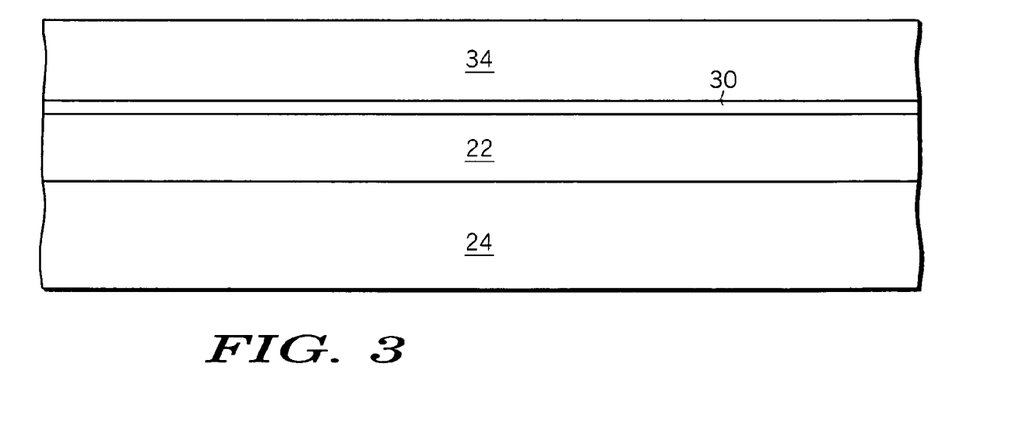
Figure 4:
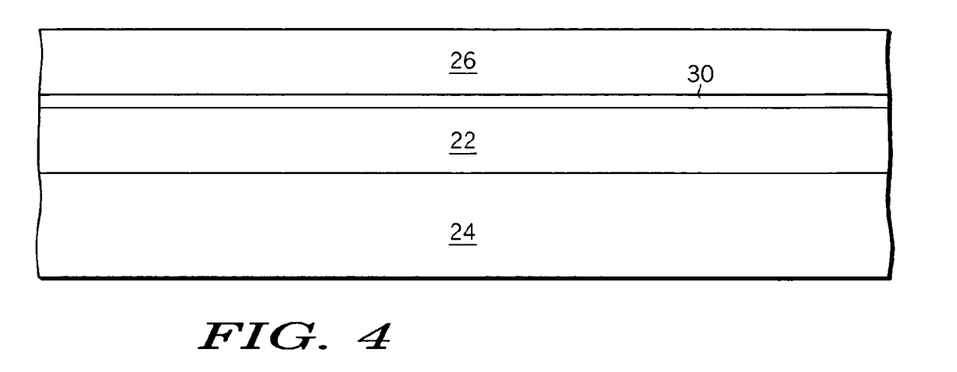

FIG. 2 illustrates one method and FIGS. 3 and 4 illustrate an alternate method, both in accordance with embodiments of the invention, for forming a silicon on insulator (SOI) layer 26 overlying silicon layer 22. FIG. 2 illustrates a process for forming a thin SOI layer 26 by the SIMOX process. The SIMOX process is a well known process in which oxygen ions are implanted into a sub-surface region of silicon layer 22 as indicated by arrows 28. The silicon layer and the implanted oxygen are subsequently heated to form a sub-surface silicon oxide layer 30 that electrically isolates SOI layer 26 from the remaining portion of silicon layer 22. The SOI layer has a thickness of about 10–100 nm. The thickness of SOI layer 26 is determined by the energy of the implanted ions; that is, the implant energy is adjusted so that the range of the implanted oxygen ions just exceeds the intended thickness of SOI layer 26. SOI layer 26 will have the same crystalline orientation as does silicon layer 22, and preferably has a <100> crystalline orientation.

In the alternate embodiment illustrated in FIGS. 3 and 4, SOI layer 26 is formed by a process of wafer bonding. As illustrated in FIG. 3, a layer of insulating material 30 such as silicon dioxide is formed on the upper surface of silicon layer 22 and/or on the surface of a second silicon wafer 34. Wafer 34 is bonded to silicon carrier substrate 24 so that insulating material 30 separates silicon layer 22 and second silicon wafer 34. As illustrated in FIG. 4, the second silicon wafer is thinned, for example by CMP, to leave thin silicon layer 26 on insulating layer 30 overlying silicon layer 22. Thin silicon layer 26, in this embodiment, can have a thickness of 10–200 nm and can be lightly impurity doped either N-type or P-type. Preferably thin silicon layer 26 is impurity doped P-type to about 30 Ohms per square and has a <100> crystalline orientation. In accordance with this embodiment of the invention thin silicon layer 26 does not have to have the same crystalline orientation as silicon layer 22. Additionally, silicon layer 22 can be thinner in this embodiment because silicon on insulator layer 26 is formed by bonding to silicon layer 22 and is not formed from silicon layer 22.

Figure 5:
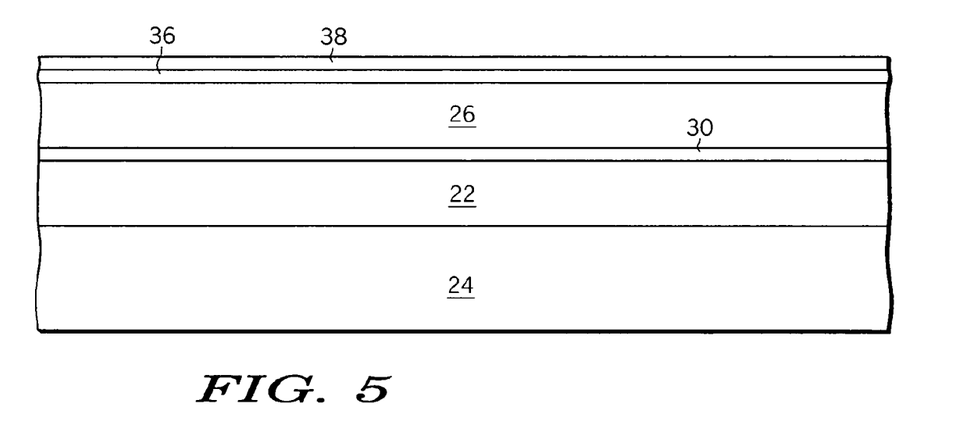

As illustrated in FIG. 5, the SOI substrate, whether formed by a SIMOX process or by a wafer bonding process, is oxidized to form a thin pad oxide 36 having a thickness of about 5–20 nm on the surface of silicon on insulator layer 26. A layer 38 of silicon nitride having a thickness of about 50–200 nm is then deposited on top of pad oxide 36. The pad oxide can be grown by heating the SOI substrate in an oxygen ambient. The silicon nitride can be deposited, for example, by low pressure chemical vapor deposition (LPCVD) or plasma enhanced chemical vapor deposition (PECVD) from the reaction of dichlorosilane and ammonia. The silicon nitride layer will subsequently be used as a CMP polish stop as explained below.

Figure 6:
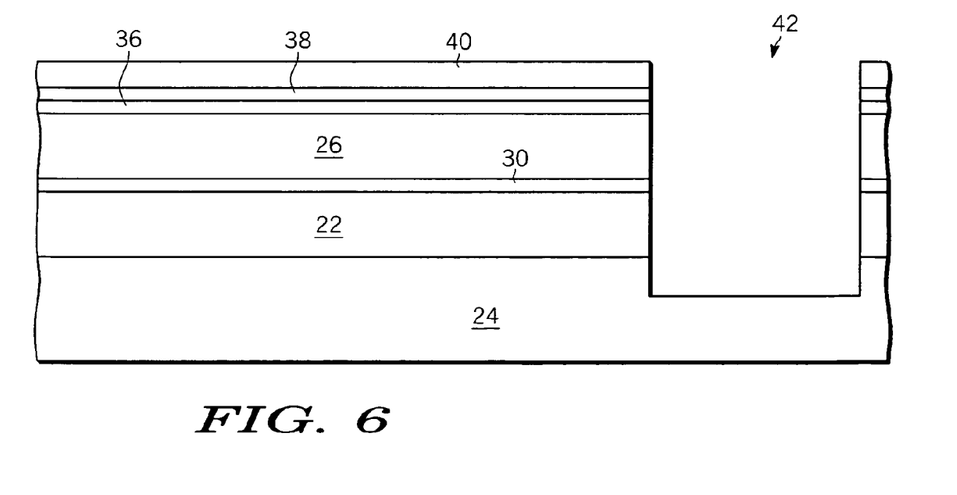

A layer 40 of photoresist is applied to the surface of silicon nitride layer 38 and is photolithographically patterned as illustrated in FIG. 6. The patterned photoresist layer is used as an etch mask and a trench 42 is etched through the layers of silicon nitride 38, oxide 36, silicon on insulator 26, insulator 30, silicon layer 22, and into the upper portion of silicon carrier substrate 24. The trench can be etched by a reactive ion etch (RIE) process using a $CF_4$ or $CHF_3$ chemistry to etch the insulator layers and a chlorine or hydrogen bromide chemistry to etch the silicon. Layer 40 of photoresist is removed after completing the etching of trench 42. Alternatively, photolithographically patterned layer 40 of photoresist can be removed after being used as an etch mask for the etching of silicon nitride layer 38. The etched layer of silicon nitride can then be used as a hard mask to mask the etching of oxide 36, silicon on insulator 26, insulator 30, and silicon layer 22. Also in this alternate process the etch step is terminated after etching into the top portion of silicon carrier substrate 24.

Figure 7:
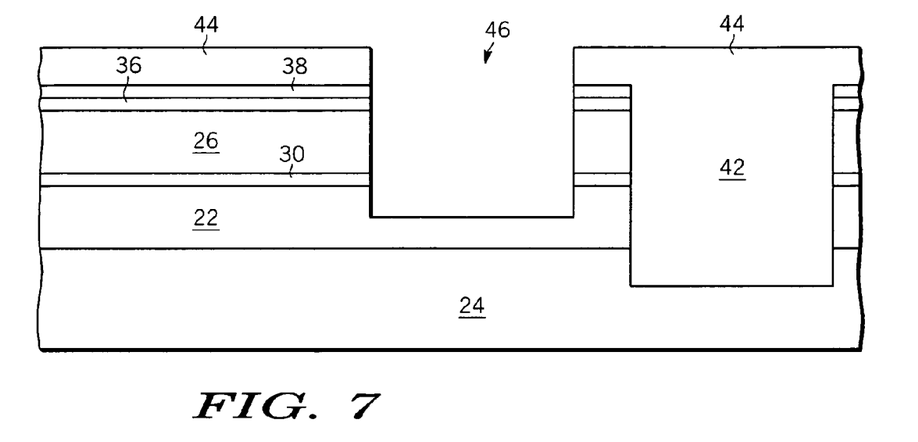

After removing layer 40 of photoresist, another layer 44 of photoresist is applied covering trench 42 and the remaining portion of silicon nitride layer 38 and is photolithographically patterned as illustrated in FIG. 7. Patterned photoresist layer 44 is used as an etch mask and a second trench, trench 46, is etched through the overlying layers and into the upper portion of silicon layer 22. As with trench 42, trench 46 can be etched by reactive ion etching. Layer 44 of photoresist can be removed after completing the etching of trench 46 or, alternatively, after the etching of silicon nitride layer 38. In the alternative process the patterned silicon nitride layer is then used as a hard mask to mask the etching of a trench through oxide layer 36, SOI layer 26, insulator layer 30 and into the upper portion of silicon layer 22. In this exemplary trench 42 extending into a portion of silicon carrier substrate 24 was etched before trench 46 extending into a portion of silicon layer 22. In accordance with an alternate embodiment of the invention (not illustrated) the order of formation of the two trenches can be reversed and trench 46 can be formed first.

Figure 8:
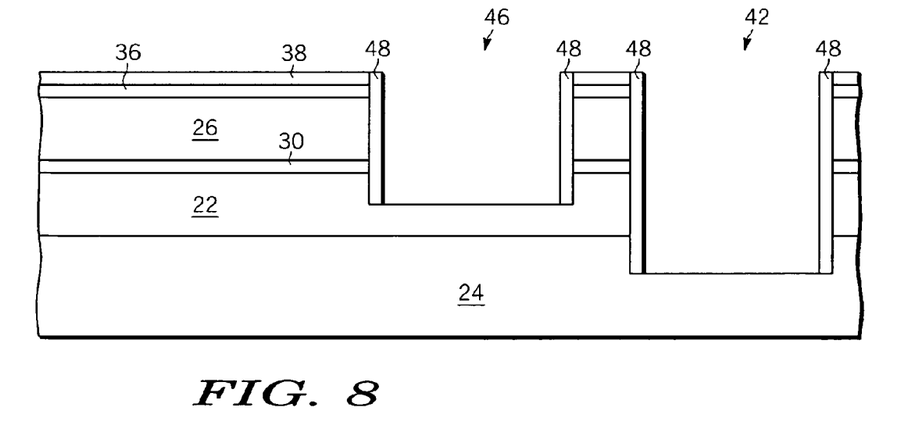

After removing photoresist layer 44, a layer of silicon oxide or silicon nitride is deposited over the surface of the structure including into trenches 42 and 44. The layer of oxide or nitride is anisotropically etched, for example by RIE, to form sidewall spacers 48 on the vertical sidewalls of trench 42 and trench 46 as illustrated in FIG. 8.

Figure 9:
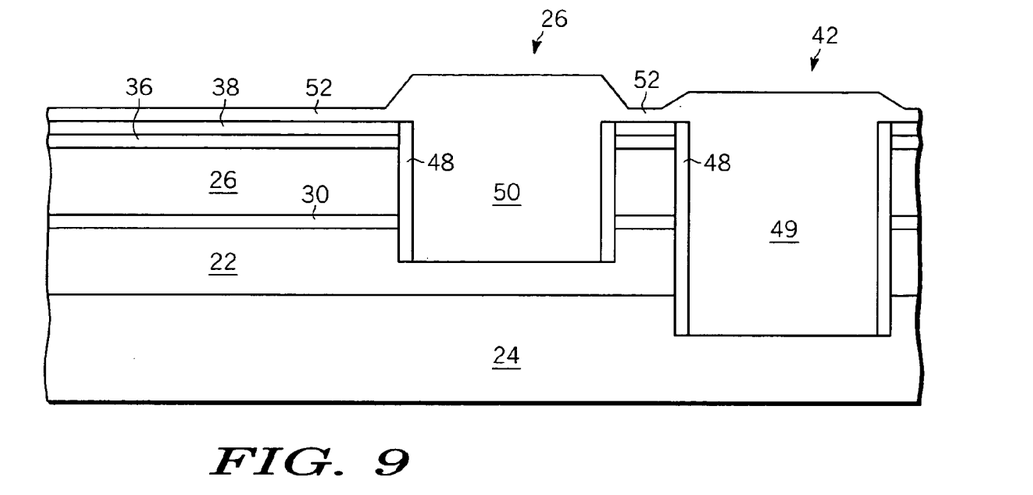

In accordance with an embodiment of the invention, selective epitaxial silicon layers 49 and 50 are then grown on the exposed silicon surfaces. Epitaxial silicon layer 49 is grown on the exposed surface of silicon carrier substrate 24 at the bottom of trench 42 and epitaxial silicon layer 50 is grown on the exposed surface of silicon layer 22 at the bottom of trench 46. The epitaxial silicon layers can be grown by the reduction of silane ($SiH_4$) or dichlorosilane ($SiH_2Cl_2$) in the presence of HCl. The presence of the chlorine source promotes the selective nature of the growth, that is, the growth of the epitaxial silicon preferentially on the exposed silicon surfaces as opposed to on the insulator (silicon oxide or nitride) surfaces. The epitaxial silicon layers grow with crystalline orientation that mimics the crystalline orientation of the silicon material upon which they are grown. In the preferred embodiment, epitaxial silicon layer 49 is grown with the same <110> crystalline orientation as silicon carrier substrate 24 and epitaxial silicon layer 50 is grown with the same <100> crystalline orientation as silicon layer 22. Sidewall spacers 48 retard nucleation of the depositing silicon on edges of trench 46 and especially on the edges of trench 42. In the absence of the sidewall spacers, the epitaxial growth might nucleate on the exposed silicon at the edges of the trenches as well as on the bottom of the trenches resulting in less than ideal epitaxial silicon layers. This is especially true of the epitaxial silicon layer grown in trench 42 because the growing layer might nucleate on <100> crystalline oriented silicon layer 22 exposed at the edges of the trench as well as on <110> crystalline oriented silicon carrier substrate 24 exposed at the bottom of the trench. Some overgrowth of silicon may occur above the level of the top surface of silicon nitride layer 38, and some silicon in the form of polycrystalline silicon 52 may deposit on silicon nitride layer 38. Polycrystalline silicon 52 may result because the epitaxial growth process may not be perfectly selective. The silicon deposited on the silicon nitride layer will be polycrystalline rather than monocrystalline because the silicon nitride does not provide a crystalline structure that the depositing silicon can mimic.

Figure 10:
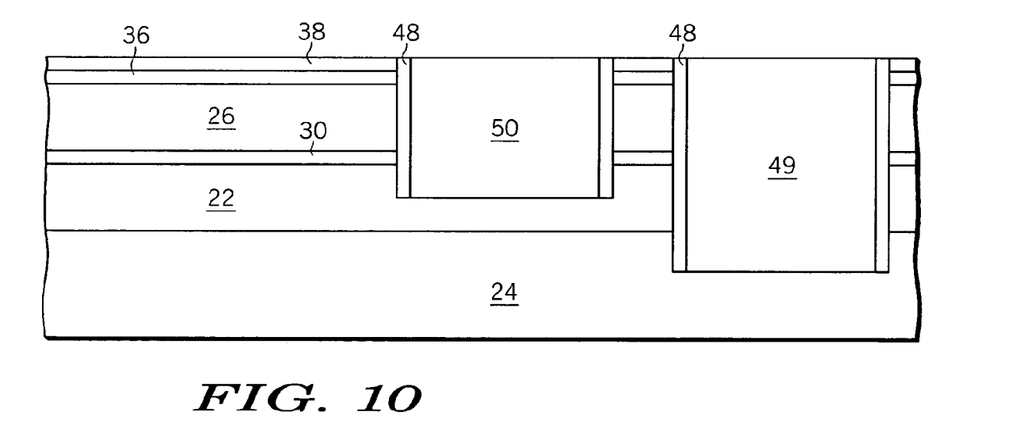

The selective epitaxial silicon that overgrows the level of the top of silicon nitride layer 38 as well as polycrystalline silicon 52 is removed by CMP as illustrated in FIG. 10. Silicon nitride layer 38 is used as a polish stop for the CMP.

Figure 11:
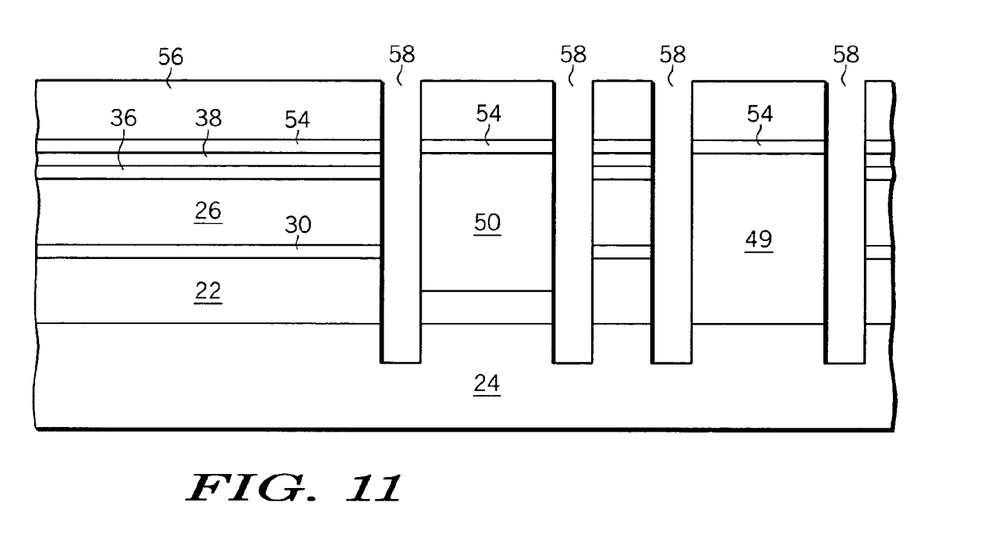

Following the planarization of the epitaxial silicon layers, another silicon nitride layer 54 is deposited on the structure. A layer 56 of photoresist is applied to silicon nitride layer 54 and is patterned as illustrated in FIG. 11. Spacers 48 are removed and trenches 58 are formed by reactive ion etching using the patterned layer of photoresist as an etch mask.

Figure 12:
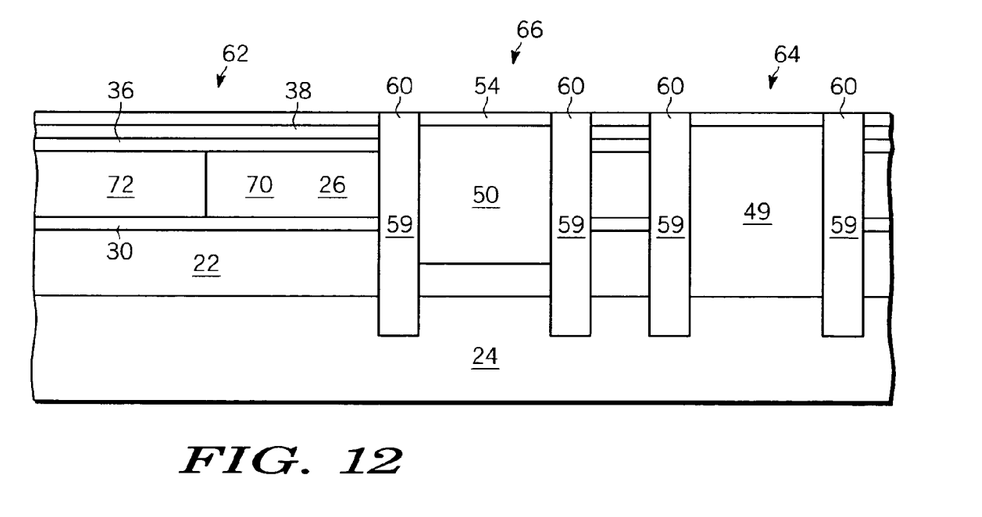

After removing spacers 48 and forming trenches 58, layer 56 of photoresist is removed and trenches 58 are filled with a deposited oxide or other insulator 59, for example, by LPCVD or PECVD. Deposited insulator 59 fills trenches 58, but is also deposited onto silicon nitride layer 54. The excess insulator on silicon nitride layer 54 is polished back using CMP to complete the formation of shallow trench isolation (STI) 60 as illustrated in FIG. 12. Silicon nitride layer 54 is used as a polish stop during the CMP process. Those of skill in the art will recognize that many known processes and many known materials can be used to form STI or other forms of electrical isolation between devices making up the integrated circuit, and, accordingly, those known processes and materials need not be discussed herein. The structure illustrated in FIG. 12 includes a silicon on insulator region 62 and two bulk silicon regions 64 and 66, one of which has a <100> crystalline orientation and the other of which has a <110> crystalline orientation. Following the formation of the shallow trench isolation, epitaxial silicon 49 and 50 in bulk regions 64 and 66, respectively, can be appropriately impurity doped in known manner, for example, by ion implantation. In accordance with the preferred embodiment of the invention, bulk region 64 has <110> crystalline orientation and is impurity doped with N-type impurities and bulk region 66 has <100> crystalline orientation and is impurity doped with P-type impurities. Regardless of whether silicon carrier substrate 24 is <110> crystalline orientation and silicon layer 22 is <100> crystalline orientation, or whether silicon carrier substrate 24 is <100> crystalline orientation and silicon layer 22 is <110> crystalline orientation, the <100> crystalline orientation region is impurity doped with P-type impurities and the <110> crystalline orientation region is impurity doped with N-type impurities. SOI region 62 can also be appropriately impurity doped in the same manner. If SOI region 62 is to be used for the fabrication of CMOS devices, portions 70 of region 62 may be doped with P-type impurities to form P-type wells for the formation of N-channel FETs and other portions 72 of region 62 may be doped with N-type impurities to form N-type wells for the formation of P-channel FETs. Impurity doping of the various regions can be carried out in well known manner, with implant species, doses, and energies determined by the type of devices to be fabricated. Implantation of selected regions can be carried out by masking other areas, for example, with patterned photoresist.

After stripping the remainder of layers 36, 38, and 54, the substantially coplanar surfaces of SOI layer 26 and of each of the bulk silicon regions 64 and 66 are exposed and the structure is ready for the fabrication of FETs necessary for implementing the desired integrated circuit function. The fabrication of the various devices, CMOS devices in portions 70 and 72 of SOI region 62 and bulk HOT P-channel and N-channel FETs in regions 64 and 66, can be carried out using conventional CMOS processing techniques. Various processing flows for fabricating CMOS devices are well known to those of skill in the art and need not be described herein. Those of skill in the art know that the various processing flows depend on parameters such as the minimum geometries being employed, the power supplies available for powering the IC, the processing speeds expected of the IC, and the like. Regardless of the processing flow employed for completing the fabrication of the IC, IC 20 in accordance with one embodiment of the invention includes a bulk N-channel HOT FET 90 fabricated in bulk silicon region 66 having <100> crystalline orientation, a bulk P-channel HOT FET 92 fabricated in bulk silicon region 64 having <110> crystalline orientation, and CMOS transistors N-channel SOIFET 96 and P-channel SOIFET 98 fabricated in portions 70 and 72 of SOI region 62, respectively. Although not illustrated, some form of electrical isolation such as shallow trench isolation could be implemented between FETs 96 and 98 or, alternatively, junctions 104 could be butted together with electrical isolation being provided by the nature of the pn junction. In the illustrated embodiment silicon carrier substrate 24 and epitaxial silicon 49 are of <110> crystalline orientation and P-channel HOT FET 92 is formed in region 64. Also in accordance with the illustrated embodiment, silicon layer 22 and epitaxial silicon 50 are of <100> orientation and N-channel HOT FET 90 is formed in region 66. The selection of <110> crystalline orientation for silicon carrier substrate in this illustrative embodiment is arbitrary; those of skill in the art will appreciate that the crystalline orientation of silicon carrier substrate 24 and silicon layer 22 can be interchanged without departing from the scope and intent of the invention.

Figure 13:
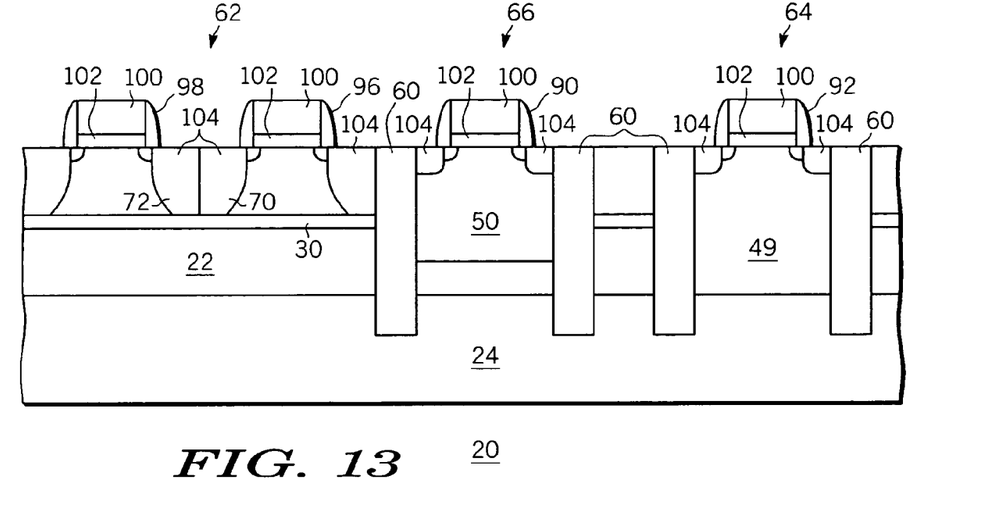

As illustrated in FIG. 13, each of bulk HOT FETs 90 and 92 and each of SOIFETs 96 and 98 include a gate electrode 100 overlying a gate insulator 102 with source and drain regions 104 positioned on each side of the gate electrode. The gate electrodes can be polycrystalline silicon, metal, silicide, or the like. The gate insulators can be silicon dioxide, silicon oxynitride, a high dielectric constant material, or the like, as required for the particular circuit function being implemented. The source and drain regions can consist of a single impurity doped region or a plurality of aligned impurity doped regions. Although not illustrated, conductive contacts and conductive traces can be coupled to appropriate gate electrodes and source drain regions to interconnect the various transistors of the integrated circuit.

Figure 14:
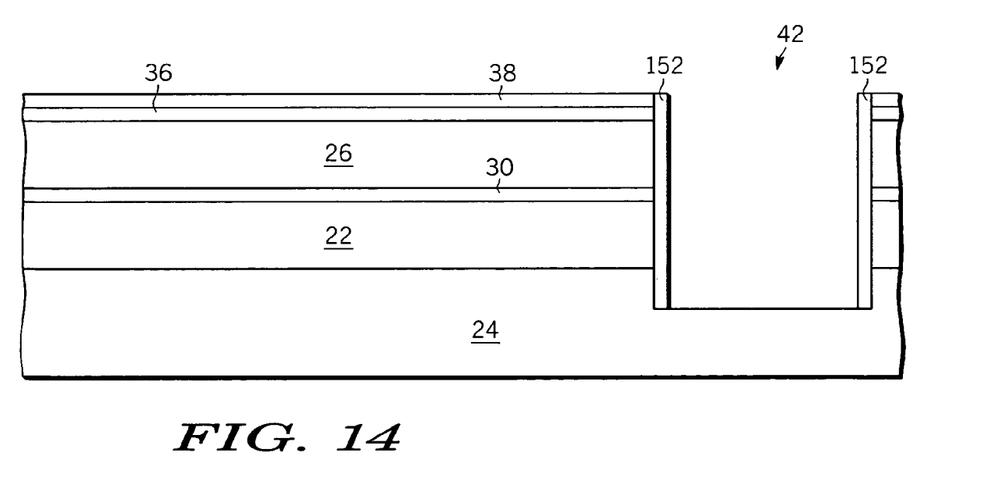
FIGS. 14–18 illustrate schematically, in cross section, method steps for manufacturing an integrated circuit in accordance with a further embodiment of the invention.

In the illustrative example, especially as illustrated in FIGS. 6–10, the <100> and <110> crystalline orientation epitaxial regions 49 and 50 are grown in the same step and the surfaces thereof are planarized in the same step. In accordance with a further embodiment of the invention the two epitaxial regions can be grown separately as illustrated in FIGS. 14–18. The method according to this embodiment of the invention is similar to the previous method up to the steps illustrated in FIG. 6. Instead of etching a second trench as illustrated in FIG. 7, however, a layer of silicon oxide or silicon nitride is deposited on the surface of nitride layer 38 and into trench 42. The deposited layer is reactive ion etched to form sidewall spacers 152 on the edges of trench 42 as illustrated in FIG. 14.

Figure 15:
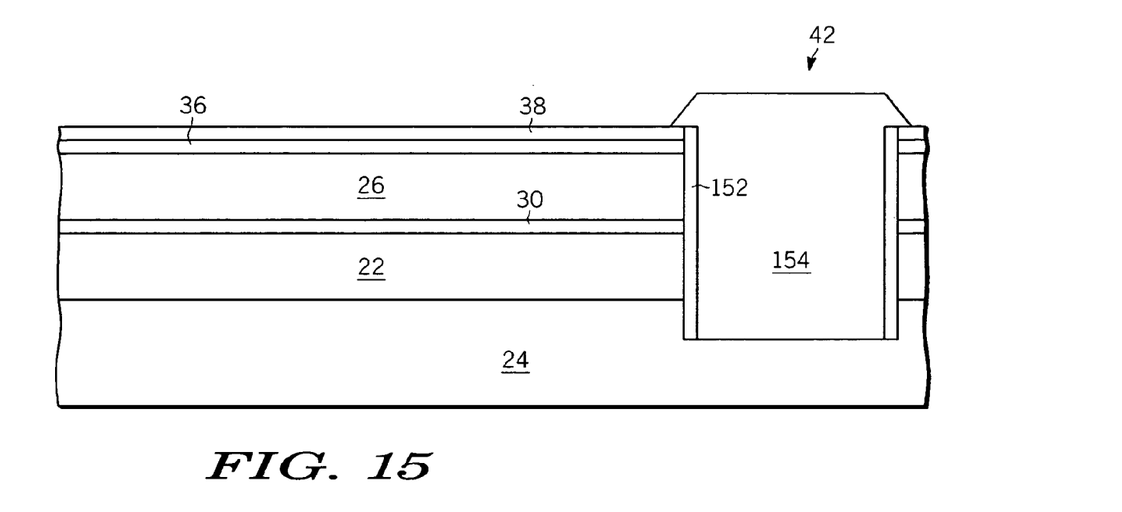

In accordance with this embodiment of the invention, as illustrated in FIG. 15, selective silicon epitaxial layer 154 is grown in trench 42 by a selective epitaxial growth process as described above. The growth of layer 154 is nucleated on the portion of silicon carrier substrate 24 exposed at the bottom of trench 42 and grows in the same crystalline orientation as that of substrate 24.

Figure 16:
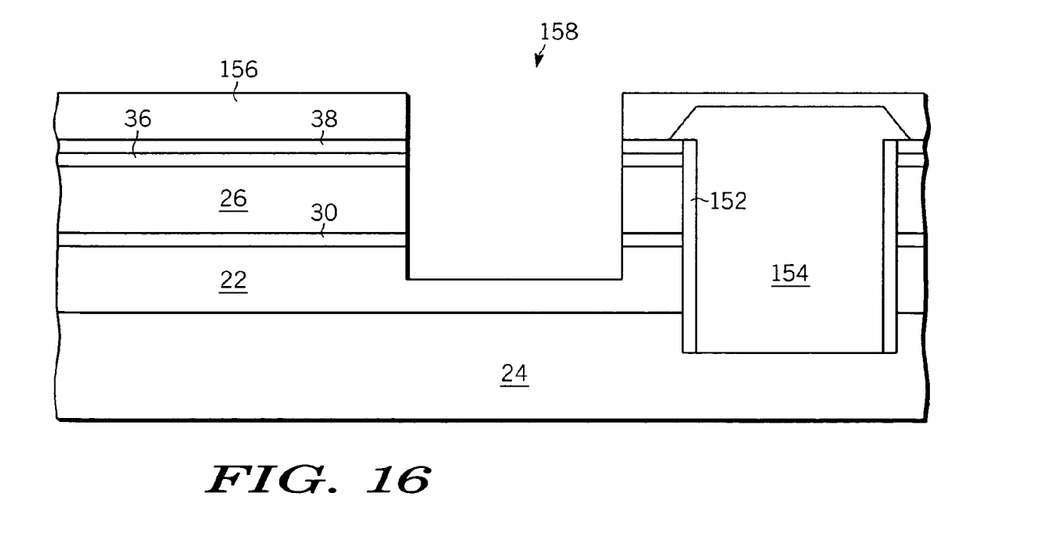

Another layer 156 of photoresist is applied covering the surface of nitride layer 38 and the surface of silicon epitaxial layer 154. The layer of photoresist is photolithographically patterned and is used as an etch mask for the etching of an additional trench 158 that extends into silicon layer 22 as illustrated in FIG. 16. Trench 158 can be etched by a RIE process.

Figure 17:
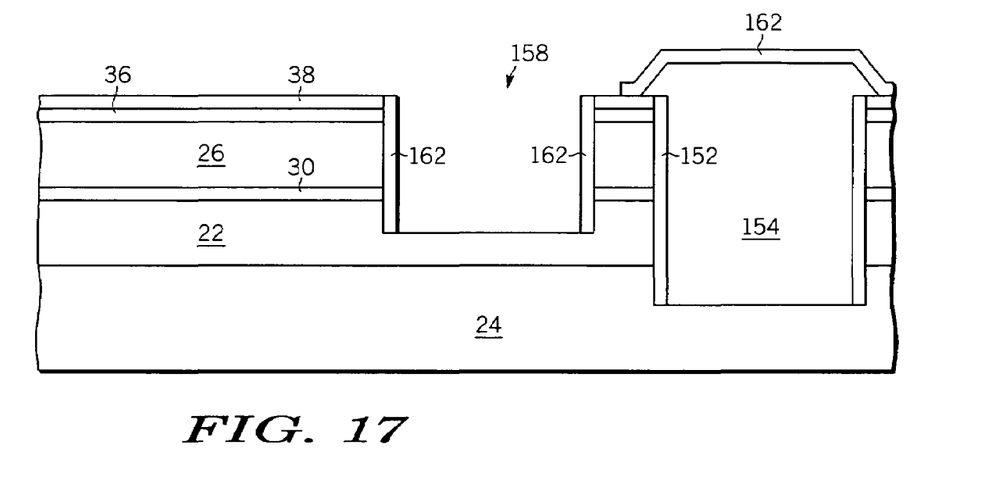

Following the etching of trench 158, photoresist layer 156 is removed and another layer of silicon oxide or silicon nitride is deposited over the surface of nitride layer 38 and the surface of silicon epitaxial layer 154. The deposited layer of silicon oxide or silicon nitride is reactive ion etched to form sidewall spacers 162 on the walls of trench 158 as illustrated in FIG. 17. In accordance with a further embodiment of the invention, as illustrated, the deposited layer is etched through a patterned photoresist layer that is retained over the surface of epitaxial layer 154 so that the layer is not removed from epitaxial layer 154.

Figure 18:
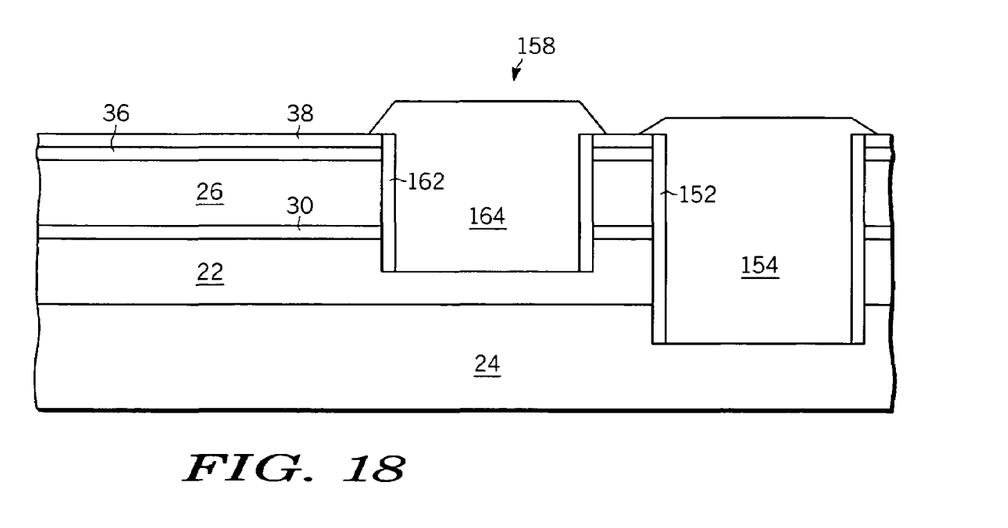

In accordance with this embodiment of the invention, as illustrated in FIG. 18, selective silicon epitaxial layer 164 is grown in trench 158 by a selective epitaxial growth process as described above. The growth of layer 164 is nucleated on the portion of silicon layer 22 exposed at the bottom of trench 158 and grows in the same crystalline orientation as that of silicon layer 22. If the deposited layer used to form spacers 162 is retained over epitaxial layer 154, that layer prevents further growth of epitaxial silicon on layer 154 during the growth of layer 164.

Any excess epitaxial silicon grown on nitride layer 38 can be removed by CMP either in a single CMP step following the growth of epitaxial layer 164 or in two separate steps, one after each of the of the separate epitaxial silicon growth steps. The CMP step or steps can also be used to remove any remaining portion of the deposited layer used to form spacers 162. Following the CMP removal of excess epitaxial silicon, the structure is the same as that illustrated in FIG. 10. The process of fabricating an integrated structure can be can be completed by following the steps illustrated in FIGS. 11–13. As with the previously described embodiment, the order in which the two trenches are etched and subsequently filled with epitaxial silicon can be reversed without departing from the scope of the invention.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. An integrated circuit comprising:
   a bulk silicon substrate comprising a first region having <100> orientation, and a second region having <110> orientation;
   a layer of silicon on insulator overlying a portion of the bulk silicon substrate;
   at least one field effect transistor formed in the layer of silicon on insulator;
   at least one P-channel field effect transistor formed in the second region; and
   at least one N-channel field effect transistor formed in the first region.

2. The integrated circuit of claim 1 wherein the at least one field effect transistor formed in the layer of silicon on insulator comprises at least one N-channel field effect transistor and at least one P-channel field effect transistor.

3. The integrated circuit of claim 1 wherein the first region comprises a P-type impurity doped region formed on the silicon substrate and the second region comprises an N-type impurity doped region formed on a silicon layer bonded to the silicon substrate.

4. The integrated circuit of claim 1 wherein the second region comprises an N-type impurity doped region formed on the silicon substrate and the first region comprises a P-type impurity doped region formed on a silicon layer bonded to the silicon substrate.

5. An integrated circuit comprising:
   a silicon substrate having a first crystalline orientation;
   a first silicon layer having a second crystalline orientation different than the first crystalline orientation bonded to the silicon substrate, the first silicon layer having an upper surface;
   an insulator layer on the upper surface of the first silicon layer;
   a second silicon layer on the insulator layer;
   a first region of first crystalline orientation grown on the silicon substrate;
   a second region of second crystalline orientation grown on the first silicon layer;
   a first field effect transistor of first channel conductivity type formed in the first region;
   a second field effect transistor of second channel conductivity type formed in the second region; and
   complementary field effect transistors formed in the second silicon layer.

6. The integrated circuit of claim 5 wherein the first crystalline orientation comprises <110> crystalline orientation and the second crystalline orientation comprises <100> crystalline orientation.

7. The integrated circuit of claim 6 wherein the first region is impurity doped N-type and the first field effect transistor is a P-channel transistor.

8. The integrated circuit of claim 5 wherein the first crystalline orientation comprises <100> crystalline orientation and the second crystalline orientation comprises <110> crystalline orientation.

9. The integrated circuit of claim 8 wherein the second region is impurity doped N-type and the second field effect transistor is a P-channel transistor.

10. An integrated circuit comprising:
    a silicon substrate having a first crystalline orientation;
    a first silicon layer having a second crystalline orientation different than the first crystalline orientation bonded to the silicon substrate;
    a layer of silicon on insulator overlying a portion of the silicon substrate and having an upper surface;

a first region of silicon having the first crystalline orientation grown on a portion of the silicon substrate and having a first upper surface;

a second region of silicon having the second crystalline orientation grown on a portion of the first silicon layer and having a second upper surface, the upper surface, the first upper surface, and the second upper surface all substantially coplanar;

a doped region of first conductivity type formed in the first region;

a doped region of second conductivity type formed in the second region;

a first field effect transistor of second channel conductivity type formed on the first region;

a second field effect transistor of first channel conductivity type formed on the second region;

complementary field effect transistors formed in the second silicon layer; and electrical isolation regions formed between the first field effect transistor and the second field effect transistor and between the complementary field effect transistors and the first and second field effect transistors.

11. A method for manufacturing an integrated circuit comprising the steps of:

providing a silicon substrate having a first crystalline orientation;

bonding a silicon layer having a second crystalline orientation to the silicon substrate, the second crystalline orientation being different than the first crystalline orientation;

forming a silicon on insulator layer overlying the silicon layer;

etching through the silicon on insulator layer and the silicon layer to expose a portion of the silicon substrate;

etching through the silicon on insulator layer to expose a portion of the silicon layer;

growing a first selective epitaxial layer on the exposed portion of the silicon substrate;

growing a second selective epitaxial layer on the exposed portion of the silicon layer; and forming a first field effect transistor in the first selective epitaxial layer, a second field effect transistor in the second selective epitaxial layer, and a third field effect transistor in the silicon on insulator layer.

12. The method of claim 11 wherein the step of providing a silicon substrate having a first crystalline orientation comprises the step of providing a silicon substrate having a <100> crystalline orientation and wherein the step of bonding a silicon layer having a second crystalline orientation comprises the step of bonding a silicon layer having a <110> crystalline orientation.

13. The method of claim 12 further comprising the steps of impurity doping first epitaxial layer P-type and impurity doping the second epitaxial layer N-type.

14. The method of claim 11 wherein the step of providing a silicon substrate having a first crystalline orientation comprises the step of providing a silicon substrate having a <110> crystalline orientation and wherein the step of bonding a silicon layer having a second crystalline orientation comprises the step of bonding a silicon layer having a <100> crystalline orientation.

15. The method of claim 12 further comprising the steps of impurity doping the first epitaxial layer N-type and impurity doping the second epitaxial layer P-type.

16. A method for manufacturing an integrated circuit comprising the steps of:

providing a silicon substrate having a first crystalline orientation; providing a silicon layer overlying the silicon substrate, the silicon layer having a second crystalline orientation different than the first crystalline orientation;

forming a silicon on insulator layer overlying a portion of the silicon layer;

growing a first epitaxial layer having the first crystalline orientation on a portion of the silicon substrate;

growing a second epitaxial layer having the second crystalline orientation on a portion of the silicon layer; and forming a first field effect transistor in the first epitaxial layer, a second field effect transistor in the second epitaxial layer, and a third field effect transistor in the silicon on insulator layer.

17. The method of claim 16 wherein the step of providing a silicon substrate having a first crystalline orientation comprises the step of providing a silicon substrate having a <100> crystalline orientation and the step of providing a silicon layer overlying the silicon substrate comprises the step of providing a silicon layer having a <110> orientation.

18. The method of claim 17 wherein the step of forming a first field effect transistor in the first epitaxial layer comprises the step of forming an N-channel field effect transistor and the step of forming a second field effect transistor in the second epitaxial layer comprises the step of forming a P-channel field effect transistor.

19. The method of claim 16 wherein the step of providing a silicon substrate having a first crystalline orientation comprises the step of providing a silicon substrate having a <110> crystalline orientation and the step of providing a silicon layer overlying the silicon substrate comprises the step of providing a silicon layer having a <100> orientation.

20. The method of claim 19 wherein the step of forming a first field effect transistor in the first epitaxial layer comprises the step of forming a P-channel field effect transistor and the step of forming a second field effect transistor in the second epitaxial layer comprises the step of forming an N-channel field effect transistor.

21. A method for manufacturing an integrated circuit comprising the steps of:

providing a silicon substrate having a first portion of a first crystalline orientation and a second portion of a second crystalline orientation;

forming a silicon on insulator layer overlying a portion of the silicon substrate;

growing a first epitaxial layer having the first crystalline orientation in contact with the first portion;

growing a second epitaxial layer having the second crystalline orientation in contact with the second portion;

planarizing the first epitaxial layer and the second epitaxial layer; and forming a first field effect transistor in the first epitaxial layer, a second field effect transistor in the second epitaxial layer, and a third field effect transistor in the silicon on insulator layer.

* * * * *